United States Patent [19]

Ushio et al.

[11] Patent Number: 4,963,974
[45] Date of Patent: Oct. 16, 1990

[54] ELECTRONIC DEVICE PLATED WITH GOLD BY MEANS OF AN ELECTROLESS GOLD PLATING SOLUTION

[75] Inventors: Jiro Ushio, Yokohama; Osamu Miyazawa, Yokosuka; Akira Tomizawa, Yokohama; Hitoshi Yokono, Ibaraki; Naoya Kanda; Naoko Matsuura, both of Yokohama; Setsuo Ando, Kawasaki; Hiroaki Okudaira, Yokohama, all of Japan

[73] Assignee: Hitachi, Ltd., Tokyo, Japan

[21] Appl. No.: 184,061

[22] Filed: Apr. 20, 1988

Related U.S. Application Data

[63] Continuation-in-part of Ser. No. 143,959, Jan. 14, 1988, Pat. No. 4,880,464, which is a continuation-in-part of Ser. No. 918,498, Oct. 14, 1986, abandoned.

[30] Foreign Application Priority Data

Oct. 14, 1985 [JP] Japan .............................. 60-226738
Apr. 18, 1986 [JP] Japan ................................ 61-88269

[51] Int. Cl.$^5$ ...................... H01L 23/08; H01L 23/52
[52] U.S. Cl. ........................................ 357/80; 428/601; 428/620; 428/632; 428/663; 428/665; 428/672; 174/250
[58] Field of Search ............... 428/601, 620, 627, 632, 428/663, 665, 672, 901, 936; 174/68.5; 357/80; 378/34, 35

[56] References Cited

U.S. PATENT DOCUMENTS

| | | |
|---|---|---|
| 4,152,601 | 5/1979 | Kadota et al. .......................... 378/35 |
| 4,288,841 | 9/1981 | Gogal ..................... 357/74 |
| 4,551,747 | 11/1985 | Gilbert et al. ........................ 357/80 |
| 4,626,479 | 12/1986 | Hosoi et al. .......................... 428/672 |
| 4,675,243 | 6/1987 | Obinata et al. ...................... 428/672 |
| 4,681,654 | 7/1987 | Clementi et al. .................... 174/68.5 |
| 4,707,394 | 11/1987 | Chant .................................. 428/601 |
| 4,724,472 | 2/1988 | Sugimoto et al. .................... 357/80 |
| 4,786,523 | 11/1988 | Dohya .................................. 428/601 |
| 4,797,508 | 1/1989 | Chant .................................. 428/601 |

Primary Examiner—Theodore Morris
Assistant Examiner—Geroge Wyszomierski
Attorney, Agent, or Firm—Antonelli, Terry, Stout & Kraus

[57] ABSTRACT

The present invention relates to an electroless gold plating solution, a method of plating by using the same, and an electronic device plated with gold by using the same.

According to the present electroless gold plating solution, the plating solution components contain no cyanide ions, the amount of a reducing agent used is small, and gold plating can be carried out without causing the gold plating on conducting paths having a fine interval between them to short-circuit the conducting paths.

Therefore, according to the method of gold plating by using said electroless gold plating solution, a plating method that is safe in the plating work and in the treatment of its waste liquor can be accomplished. The method has a feature that the method can provide an electronic device on which parts can be mounted highly densely, and wherein the joint reliability to the parts is high.

36 Claims, 9 Drawing Sheets

FIG. 19(a)
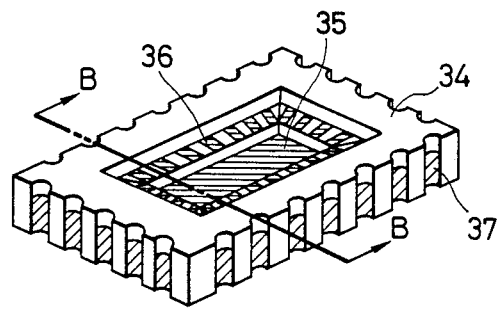
FIG. 19(b)
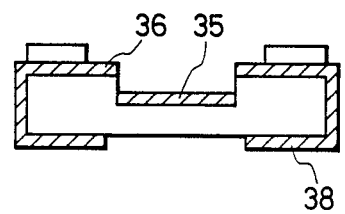
FIG. 20(a)  FIG. 20(b)
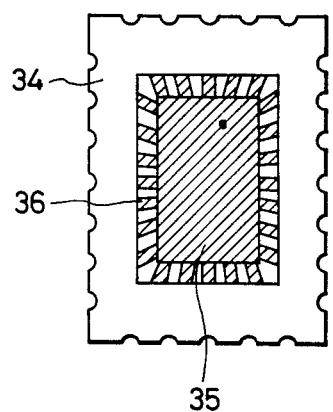 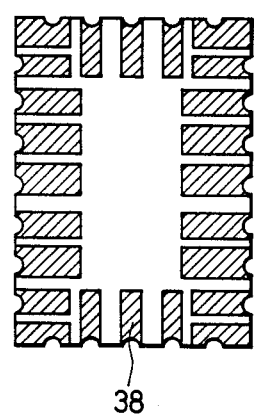

ELECTRONIC DEVICE PLATED WITH GOLD BY MEANS OF AN ELECTROLESS GOLD PLATING SOLUTION

This application is a continuation-in-part application of application Ser. No. 143,959, filed Jan. 14, 1988, now U.S. Pat. No. 4,880,464, which is a continuation application of application Ser. No. 918,498, filed Oct. 14, 1986, abandoned.

BACKGROUND OF THE INVENTION

The present invention relates to an electroless gold plating solution, a method of plating with gold by using the same, and an electronic device plated by using the same.

As a prior electroless gold plating solution is known one containing, as major components, potassium dicyanoaurate (I), potassium cyanide, and a borane compound as disclosed in "Plating", Vol. 57 (1970), pages 914 to 920. According to the technique, a plating solution having a deposition rate of 1 $\mu$m/h can be obtained. However, if the electroless gold plating solution is applied to circuit boards having surface conducting paths with the interval between the conducting paths small, gold is liable to deposit even on the insulator surface between the conducting paths. In addition the electroless gold plating solution contains a large amount of cyanide ions, which causes safety problems in the plating operation and in the treatment of its waste solution.

As an electroless gold plating solution that contains no cyanide ions, one whose major components, a tetrachloroaurate (III) and hydrazine is disclosed in U.S. Pat. No. 3,300,328, and one containing as major components, potassium tetrachloroaurate (III) and a borane compound is disclosed in Japanese Patent Publication No. 20353/1981. However, the electroless gold plating solutions disclosed in U.S. Pat. No. 3,300,328, and Japanese Patent Publication No. 20353/1981 have the problem that because the gold ion in the gold complex is trivalent a larger amount of a reducing agent is required in comparison with the case using potassium dicyanoaurate (I). Further, the electroless gold plating solution disclosed in U.S. Pat. No. 3,300,328 has such a problem that it is unstable to cause precipitation to in the plating solution within about 2 hours, which does not allow the continuation of the plating.

Now the relationship between gold plating and electronic devices will be described. Electronic computers can be mentioned as a typical example where this relationship is most conspicuously noticed. As described in "Saiensu", Vol. 13 (1983), pages 13 to 25, in electronic computers, it is possible to decrease the delay of electric signals due to a circuit board by mounting semiconductor chips on the circuit board highly densely, and as a result the computing speed of the electronic computer can be improved. To increase the packing density of semiconductor chips, it is required to increase the density of the surface conducting paths of the circuit board. On the other hand, to join semiconductor chips by soldering, and to carry out engineering change such as wiring alteration by wire bonding, it is required that the top surface of the surface conducting paths of the circuit board is covered with metal layers made of gold. In particular, the thickness of metal film at the surface conducting paths where wire bonding will be effected has to be 0.5 $\mu$m or over to guarantee the joint reliability of the wire bonding. Consequently, to improve the packing density of semiconductor chips, namely, to realize a high-speed electronic computer, it is essential to provide a method of forming a gold film having a thickness of 0.5 $\mu$m or over on conducting paths that are highly dense and complicated in shape.

Hitherto, electroplating has been used widely to form a gold film having a thickness of 0.5 $\mu$m or over on a conductor by plating. However, if the above circuit board is plated with gold, then for electrically isolated conducting paths that are present in great numbers on the circuit board, conducting paths for continuity are to be formed between the electrically isolated conducting paths and it is required that the conducting paths are cut after the plating. For that purpose, the interval between the conducting paths whereby parts actually can be mounted cannot be made smaller than 400 $\mu$m. Therefore, when gold electroplating is employed, the wiring density for semiconductor chips is decreased due to the presence of the conducting paths for continuity, leading to a problem that the improvement in the packing density of semiconductor chips is limited. Further, if the above electroless plating solution containing cyanide ions is used, although the above problem involved in the electroplating can be solved, gold is also liable as described above to deposit on a part of the insulator between conducting paths where the interval between the conducting paths is small. In particular, this phenomenon takes place noticeably in the case of a circuit board having surface conducting paths whose interval is 200 $\mu$m or below. Therefore, when the above electroless gold plating solution containing cyanide ions is applied for the production of a circuit board having surface conducting paths whose interval is 200 $\mu$m or below, the yield becomes poor. The above electroless gold plating solutions containing no cyanide ions are also unstable, and they are impossible to be applied to the mass production of a circuit board having surface conducting paths whose interval is 200 $\mu$m or below, for the similar reason to the above electroless gold plating solution containing cyanide ions.

SUMMARY OF THE INVENTION

The first object of the invention is to provide an electroless gold plating solution capable of plating conducting paths whose interval is very small without causing gold to short-circuit the conducting paths, characterized in that the plating solution components contain no cyanide ions, and the amount of a reducing agent used is small.

The second object of the invention is to provide a method of electroless plating free from any safety problems in the plating operation and in the treatment of its waste solution.

The third object of the invention is to provide an electronic device on which parts can be mounted highly densely, and whose joint reliability to the parts is high.

The fourth object of the invention is to provide a module on which parts can be mounted highly densely, and whose joint reliability to the parts is high.

The fifth object of the invention is to provide a circuit board on which parts can be mounted highly densely, and joint reliability to the parts is high.

The sixth object of the invention is to provide a leadless chip carrier excellent in solderability.

The seventh object of the invention is to provide a tape carrier, the bonding strength of the conducting paths on the tape to electronic elements being high, and the efficiency of the utilization of the base film of the tape also being high.

The eighth object of the invention is to provide an X-ray lithography mask high in dimensional accuracy The above first object is achieved by providing an electroless gold plating solution comprising an aqueous solution that contains monovalent gold ions, a complexing agent which has a greater bond energy to the monovalent gold ions than hydroxide ions have, and a reducing agent.

The above second object is achieved by providing a method of plating with gold by using the above electroless gold plating solution according to the invention.

The above third to eighth objects are achieved by providing an electronic device, a module, a circuit board, a leadless chip carrier, a tape carrier, and an X-ray lithography mask that are plated with gold by using the above electroless gold plating solution.

The reason why the composition of the present electroless gold plating solution has been defined as described above is based on the following. The reason why a large amount of cyanide ions is used in the prior electroless gold plating solution is that the precipitation of gold which will occur in when the gold complex reacts with hydroxide ions present in the plating solution is prevented by the cyanide ions that can bond as complexing agent to monovalent gold ions to form a stable gold complex. However, even when the prior electroless gold plating solution containing cyanide ions is used, gold sometimes happens to precipitate on the surface of an insulator where gold essentially cannot precipitate, and therefore it could not have been said that the prior gold plating solution containing cyanide ions is stable enough to be practical. The inventors considered that this is due to the assumption that, although the bond strength of a cyanide ion to a monovalent gold ion is considerably great, the bond strength is not so strong as the bond strength of a hydroxide ion to a monovalent gold ion. That is, it can be considered that since a hydroxide ion bonds more strongly to a monovalent gold ion than a cyanide ion does, gold hydroxide or gold oxide resulting therefrom precipitates. Further, when the precipitate adheres to the insulator surface, and gold precipitates thereon, a gold film may be formed even on the insulator surface Even in the case wherein the prior electroless gold plating solution contains no cyanide ions, it is considered that the bond energy of the complexing agent used therein to a gold ion is smaller than that of a hydroxide ion, and therefore, a gold film is liable to be formed on the insulator surface, and the electroless gold plating solution is also not practical. In order to obtain a practical electroless gold plating solution, a complexing agent which has a greater bond strength to a monovalent gold ion than a hydroxide ion has must be found, but it is very difficult to find such a preferable complexing agent from countless compounds. Therefore, the inventors have used the molecular orbital method in quantum chemistry to determine chemical bond strengths theoretically, thereby finding excellent complexing agents. As a calculating method, the "ab initio SCF method" that is currently considered the most accurate has been adopted.

First, the origin of the strength of the bond between a monovalent gold ion and a cyanide ion that has hitherto been considered most strong has been studied. As a result it has been found that, in the interaction between a gold ion and a cyanide ion, there is only $\theta$ electron transfer from the cyanide ion to the gold ion, and there is little $\pi$ electron transfer. Therefore, the inventors have judged that, as a ligand that can be substituted for a cyanide ion, a strongly electron donative ligand is preferable.

With respect to 13 complexing agents including a cyanide ion that have been, from experience, considered strongly electron donative and are listed in Table 1, the bond energy to a monovalent gold ion has been studied, and the order of the bond energies given in Table 1 have been obtained.

TABLE 1

| Complexing agent | Bond energy (kcal/mol) |
|---|---|
| $S_2O_3^{2-}$ | 274 |
| $SO_3^{2-}$ | 270 |
| $OH^-$ | 260 |
| $SH^-$ | 197 |
| $CN^-$ | 196 |
| $Cl^-$ | 173 |
| $I^-$ | 157 |
| $SCN^-$ | 122 |
| $NH_3$ | 65 |
| $CNCH_3$ | 56 |
| $NCCH_3$ | 53 |
| $PH_3$ | 39 |
| $CO$ | 19 |

Herein, the bond energy was calculated as the difference between energies before and after the formation of the bond between a monovalent gold ion and a complexing agent. If the above difference of energies concerning a gold ion and a complexing agent in a vacuum can be determined experimentally, that difference can be used as the bond energy. From the accuracy of the above method of computation, it can be considered that the order of the levels of the bond energies does not change between that of the experimental values and that of the calculated values. The result of the calculation, that the bond energy of a hydroxide ion to a monovalent gold ion is greater than that of a cyanide ion to a monovalent gold ion, supports that the prior electroless gold plating solution using cyanide ions is unstable, which shows the above calculation is appropriate.

Based on this result, although the bond energies described above do not take hydration effect into consideration, it is highly probable that the essence of the real system can be considered by using the bond energies described above.

Among the 12 complexing agents, complexing agents having higher bond energies to a monovalent gold ion than a hydroxide ion were a thiosulfate ion and a sulfite ion only. Therefore, the inventors have considered that a thiosulfate ion and a sulfite ion are the most preferable to be used in an electroless gold plating solution.

Further, among known reducing agents, the inventors have selected experimentally ones which are preferable when a thiosulfate ion or a sulfite ion is used as a complexing agent. As a result, we have found that when thiourea, or its derivative such as methylthiourea, N-methylthiourea, and N-ethylthiourea, or hydroquinone, or its derivative such as methylhydroquinone, and ethylhydroquinone is used as a reducing agent, an aqueous solution containing monovalent gold ions and thiosulfate ions or an aqueous solution containing monovalent gold ions and sulfite ions can constitute a stable electroless gold plating solution The present electroless gold plating solution has been obtained based on the above finding.

Herein, monovalent gold ions can be introduced into the plating solution by using, as a gold source, a gold (I)

complex salt other than dicyanoaurate (I) complex salts such as a thiosulfatoaurate (I) complex salt. A thiosulfatoaurate (I) complex salt is a complex salt containing at least one thiosulfate ion around a gold atom per molecule. For example, dithiosulfatoaurate (I) can be mentioned and the molecular formula therefor is $M_3[Au(S_2O_3)_3]$, wherein M represents an alkali metal, for example $M_3$ may represents $Na_2K$. Further, a monovalent gold ion can be formed in an aqueous solution containing a mixture of a tetrahalogenoaurate (III) and a thiosulfate, so that that aqueous solution can be used. The molecular formula for a tetrahalogenoaurate (III) is $MAuX_4$ wherein M represents an alkali metal such as Na, and K, and X represents a halogen atom such as F, and Cl, and as an example of a tetrahalogenoaurate (III) can be mentioned a tetrachloroaurate (III). A thiosulfate can be represented for example by $M_2S_2O_3$ wherein M represents an alkali metal such as Na, and K. Since the thiosulfate ion or a sulfite ion is produced in an aqueous solution of a thiosulfate or a sulfite, a thiosulfate or a sulfite may be considered as a complexing agent.

The electroless gold plating solution according to the present invention has characteristics as mentioned above. By forming a gold coating film on an electronic device, a module, a circuit board, a leadless chip carrier, a tape carrier, and an X-ray lithography mask the present electroless gold plating solution exhibits an excellent effect that has not been expected from the prior gold plating.

BRIEF DESCRIPTION OF THE DRAWINGS

FIG. 19 (a) is a perspective view of a leadless chip carrier plated with gold by using an electroless plating solution according to the present invention, and FIG. 19 (b) is a sectional view taken along line B—B of FIG. 19 (a).

FIG. 20 (a) is a plan view of the leadless chip carrier of FIG. 19, and FIG. 20 (b) is a bottom view of the leadless chip carrier of FIG. 19.

DETAILED DESCRIPTION OF THE PREFERRED EMBODIMENTS

The present invention will now be described in detail by the following examples.

EXAMPLE 1

Figure 2:
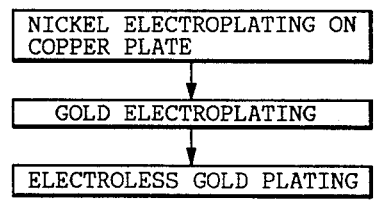
FIG. 2 is a flow chart of an example of a process of applying electroless gold plating onto a copper plate, showing a plating method of successively laminating a nickel film by electroplating, a gold film by electroplating, and a gold film by electroless plating.

A nickel coating having a thickness of 2 μm was formed on each copper plate 2.5 cm by 2.5 cm by 0.3 mm by the process shown in FIG. 2 using a usual nickel electroplating solution, and then a gold coating having a thickness of 1 μm was formed thereon by using a usual gold electroplating solution to obtain a sample. The samples were degreased, then washed with dilute hydrochloric acid, and washed with water well. After the samples were dried by nitrogen gas blow, the samples were weighed. The samples were immersed for 2 hours in electroless gold plating solutions according to the invention that had the formulations shown below under the plating conditions shown below.

| Formulations of the electroless gold plating solutions and plating conditions | |
|---|---|
| (a) Sodium dithiosulfatoaurate (I) | 0.02 mol/l |
| Sodium thiosulfate | 0.2 mol/l |
| Thiourea | 0.2 mol/l |
| Sodium sulfite | 0 2 mol/l |
| Ammonium chloride | 0.2 mol/l |
| Water | 1 l |
| Solution temperature | 60° C. |
| pH | 7.0 |
| (b) Sodium dithiosulfatoaurate (I) | 0.02 mol/l |
| Sodium thiosulfate | 0.25 mol/l |
| Thiourea | 0.1 mol/l |
| Sodium sulfite | 0.2 mol/l |
| Ammonium chloride | 0.2 mol/l |
| Water | 1 l |
| Solution temperature | 80° C. |
| pH | 8.5 |
| (c) Sodium dithiosulfatoaurate (I) | 0.05 mol/l |
| Sodium thiosulfate | 0.5 mol/l |
| N-methylthiourea | 0.1 mol/l |
| Sodium sulfite | 1.0 mol/l |
| Sodium tetraborate | 0.1 mol/l |
| Water | 1 l |
| Solution temperature | 70° C. |
| pH | 8.0 |
| (d) Sodium tetrachloroaurate (III) | 0.025 mol/l |
| Sodium thiosulfate | 0.25 mol/l |
| Hydroquinone | 0.04 mol/l |
| Sodium sulfite | 0.3 mol/l |
| Sodium tetraborate | 0.1 mol/l |
| Water | 1 l |
| Solution temperature | 80° C. |
| pH | 9.0 |
| (e) Sodium tetrachloroaurate (III) | 0.025 mol/l |
| Sodium thiosulfate | 0.1 mol/l |
| Methylhydroquinone | 0.05 mol/l |
| Sodium sulfite | 0.4 mol/l |
| Sodium tetraborate | 0.2 mol/l |
| Water | 1 l |
| Solution temperature | 70° C. |
| pH | 10.0 |

Figure 1:
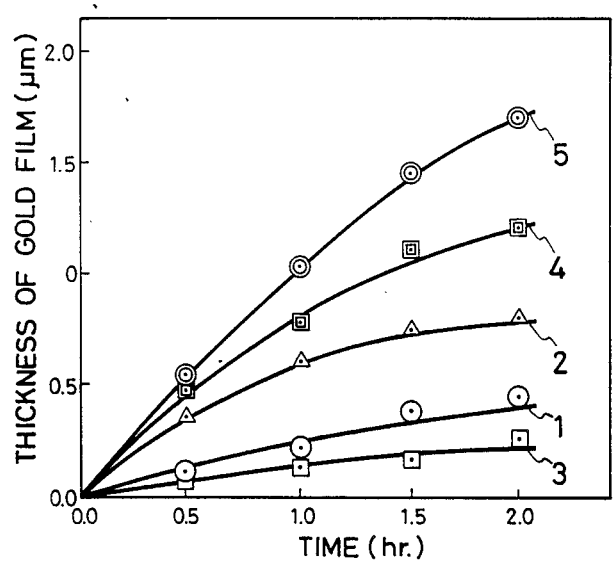
FIG. 1 is a graph showing the relationship between the thickness ($\mu$m) of gold coating and the plating time (h) obtained when gold was deposited by using an electroless gold plating solution of the present invention.

Each of the above plating solutions was stirred forcibly, and every 30 minutes the sample was taken out, and the gold film thickness was determined by the gravimetric method. The results are given in FIG. 1 as curves 1–5 that correspond to (a) and (e) above. The deposited gold film in any of the cases using the above plating solutions had a mat bright yellow color, and no precipitation was observed in any of the plating solutions.

Deposition rates and the presence of a precipitation in the plating solutions having formulations outside the above formulations were examined under plating conditions outside the above plating conditions, and preferable ranges of the amounts of components in the formulations and plating conditions were obtained as shown below.

(1) The amount of the dithiosulfatoaurate (I) complex salt was favorably 0.001 to 0.2 mol/l, preferably 0.006 to 0.04 ml/l, and particularly preferably 0.01 to 0.03 mol/l. If the amount was less than 0.001 mol/l, the reaction became slow, whereas if the amount was more than 0.2 mol/l, a precipitation of gold occurred in the plating solution.

(2) When a mixture of the tetrahalogenoaurate (III) and the thiosulfate was used as a source of gold, the amount of the tetrahalogenoaurate (III) was favorably 0.001 to 0.2 mol/l, preferably 0.006 to 0.05 mol/l, and particularly preferably 0.01 to 0.03 mol/l. If the amount was less than 0.001 mol/l, the reaction became slow, whereas if the amount was more than 0.2 mol/l, a precipitation of gold occurred in the plating solution.

(3) The amount of the reducing agent was favorably 0.001 to 1.0 mol/l, preferably 0.01 to 0.5 mol/l, and particularly preferably 0.02 to 0.3 mol/l. If the amount was less than 0.001 mol/l, the reaction became slow, whereas if the amount was more than 1.0 mol/l, the effect on the plating was not specially improved, and the excess amount of the reducing agent was wasteful.

(4) The amount of the thiosulfate was favorably 0.001 to 0.9 mol/l, and if the thiosulfatoaurate (I) complex salt was used as a gold source, the amount is preferably 0.01 to 0.4 mol/l, and particularly preferably 0.05 to 0.1 mol/l. If the tetrahalogenoaurate (III) was used as a gold source, the amount was preferably 0.003 to 0.6 mol/l, and particularly preferably 0.04 to 0.2 mol/l. If the amount was less than 0.001 mol/l, a precipitation of gold likely occurred, whereas if the amount was more than 0.9 mol/l, a precipitation of sulfur occurred.

(5) The amount of the sulfite as a stabilizer was favorably 0.01 to 0.8 mol/l, preferably 0.08 to 0.7 mol/l, and particularly preferably 0.15 to 0.5 mol/l. If the amount was less than 0.01 mol/l, a precipitation of sulfur likely occurred, whereas if the amount was more than 0.8 mol/l, the reaction of the plating became slow.

(6) The amount of the pH adjuster was favorably 0.09 to 1.0 mol/l, preferably 0.4 to 1.0 mol/l, and particularly preferably 0.4 to 0.8 mol/l. If the amount was less than 0.09 mol/l, the deposition rate became reduced after the start of the plating reaction, whereas if the amount was more than 1.0 mol/l, the effect on the plating was not specially improved, and the pH adjuster became wasteful.

(7) The solution temperature was 60° to 90° C., preferably 65° to 85° C., and particularly preferably 70° to 80° C. If the solution temperature was lower than 60° C., the plating reaction became slow, whereas if the solution temperature was higher than 90° C., a precipitation occurred in the plating solution.

(8) The pH of the plating solution was favorably 7.0 to 11.0, preferably 7.5 to 10.0, and particularly preferably 8.0 to 9.0. If the pH was lower than 7.0, the plating reaction became slow, whereas if the pH was higher than 11.0, a precipitation occurred in the plating solution.

EXAMPLE 2

Samples prepared in the same way as those in Example 1 were immersed in an electroless gold plating solution having the following composition according to the invention under the following plating conditions. In this Example, as a complexing agent, sodium sulfite was used.

| Composition of the electroless gold plating solution and the plating conditions | |
|---|---|
| Sodium dithiosulfatoaurate (I) | 0.02 mol/l |
| Sodium sulfite | 0.5 mol/l |
| Thiourea | 0.2 mol/l |
| Sodium tetraborate | 0.08 mol/l |
| Water | 1 l |
| Solution temperature | 90° C. |
| pH | 8.0 |

The above plating solution was stirred forcibly, and after two hours, the thickness of the gold film was measured by the gravimetric method. The thickness of the gold film was 2.1 $\mu$m. The deposited gold film was mat and bright yellow, and no precipitation was observed in the plating solution. The deposition rate and the presence of precipitation in the plating solution was examined using amounts of sodium sulfite outside the above amount, and a preferable range of the amount of the sulfite given below was obtained. The amount of the sulfite as a complexing agent was favorably 0.005 to 0.5 mol/l, preferably 0.03 to 0.4 mol/l, and particularly preferably 0.05 to 0.3 mol/l. If the amount was less than 0.005 mol/l or more than 0.5 mol/l, a precipitation of gold was likely to occur.

EXAMPLE 3

Figure 3:
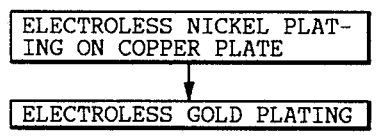
FIG. 3 is a flow chart of an example of a process of applying electroless gold plating onto a copper plate, showing a plating method of successively laminating a nickel film by electroless plating, and a gold film by electroless plating.

A nickel film having a thickness of 2 $\mu$m and then a gold film having a thickness of 1 $\mu$m were formed by the process shown in FIG. 3 on a copper plate 2.5 cm×2.5 cm×0.3 mm to prepare a sample. After the sample was pretreated in the same way as Example 1, the sample was immersed in the present electroless gold plating solution having the composition shown in (e) above in Example 1 under the plating conditions shown in (e) in Example 1. The plating solution was forcibly stirred, and after two hours the thickness of the gold film was measured by the gravimetric method. The thickness of the gold film was 1.2 $\mu$m. The deposited gold film was slightly lustrous bright yellow, and no precipitation was observed in the plating solution.

EXAMPLE 4

Figure 4:
FIG. 4 is a flow chart of an example of a process of applying electroless gold plating onto a copper plate, showing a plating method of successively laminating a gold film formed by sputtering and a gold film by electroless plating.

A gold film having 2000Å was formed on a copper plate 2.5 cm×2.5 cm×0.3 mm by the process shown in FIG. 4 using a usual sputtering unit to prepare a sample. After the sample was pretreated in the same way as Example 1, the sample was immersed in the present electroless gold plating solution having the composition shown in (e) in Example 1 under the plating conditions shown in (e) in Example 1. The plating solution was forcibly stirred, and after two hours the thickness of the gold film was measured by the gravimetric method. The thickness of the gold film was 1.3 $\mu$m. The deposited gold film was mat and bright yellow, and no precipitation was observed in the plating solution.

EXAMPLE 5

Figure 5:
FIG. 5 is a flow chart of an example of a process of applying electroless gold plating onto a copper plate, showing a plating method of successively laminating a gold film formed by vacuum deposition, and a gold film by electroless plating.

A gold film having a thickness of 1000Å was formed by the process shown in FIG. 5 using a usual metallizing apparatus on a copper plate 2.5 cm×2.5 cm×0.3 mm to prepare a sample. After the sample was pretreated in the same way as Example 1, the sample was immersed in the present electroless gold plating solution having the composition shown in (b) in Example 1 under the plating conditions shown in (b) in Example 1. The plating solution was forcibly stirred, and after two hours the thickness of the gold film was measured by the gravimetric method. The thickness of the gold film was 1.5 $\mu$m. The deposited gold film was mat, and bright yellow, and no precipitation was observed in the plating solution.

EXAMPLE 6

Figure 10:
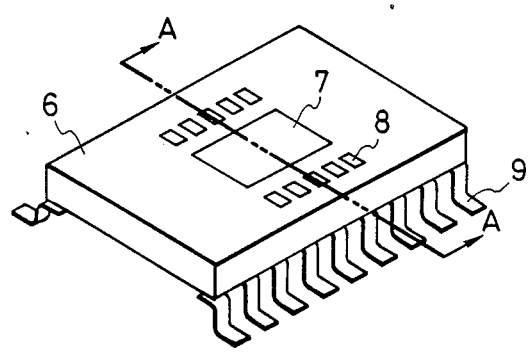
FIG. 10 is a perspective view of a ceramic circuit board plated with gold by using an electroless gold plating solution according to the invention.
Figure 11:
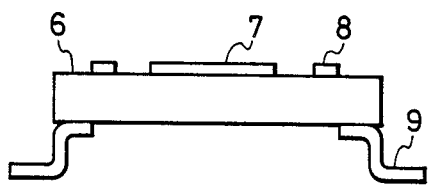
FIG. 11 is a sectional view taken along line A—A of FIG. 10.

Each alumina ceramic board plated with gold using an electroless gold plating solution according to the invention is shown in FIG. 10 and a sectional view thereof is shown in FIG. 11. The surface of each conductor of a die bonding pad 7 of tungsten, wire bonding pads 8 of tungsten, and leads 9 of Kovar ® was plated by the plating process shown in FIG. 6. After each conductor was activated by a usual palladium activator, a nickel film having a thickness of 3 $\mu$m was formed thereon by using a usual electroless nickel plating solution, and then a gold film having a thickness of 0.3 $\mu$m was formed by using a usual displacement gold plating solution. The board was washed with a decreasing solution and then dilute hydrochloric acid, and then with was dried by nitrogen gas blow. Then the board was immersed for 3 hours in the electroless gold plating solution according to the present invention having the composition shown in (a) in Example 1 under the plating conditions shown therein, and the plating solution was stirred forcibly. The deposited gold film had a thickness of 1.8 $\mu$m.

20 ceramic boards thus prepared were used as samples, and the joining properties of the gold plated parts thereof were assessed as follows.

(1) Die-bonding property

After die-bonding of the die-bonding pad and the silicon chip was carried out at 430° C. in a nitrogen atmosphere by a usual method, a heat shock test (0° C.←→200° C., 5 cycles with each cycle for 10 sec), was carried out and one wherein the silicon chip did not come off was assessed as good one.

(2) Wire bonding property

After a gold wire having a diameter of 25 $\mu$m was pressed to be in contact with the wire bonding pad 8 of the sample heated to about 150° C., the wire was pulled by applying a load of 6 g, and one wherein the wire did not come off from the wire bonding pad 8 was assessed as a good one.

(3) Solderability

After the sample was heated at 460° C. for 15 min in air, the leads 9 were immersed in solder, and one wherein 95% or over of the lead area was wetted with the solder was assessed as a good one.

As a result of the above assessment, all of the 20 samples were assessed as good ones. Therefore, when electroless gold plating solutions according to the present invention are used, a ceramic circuit board having conducting paths of tungsten and excellent in joining properties can be obtained in a safe working environment.

EXAMPLE 7

Figure 7:
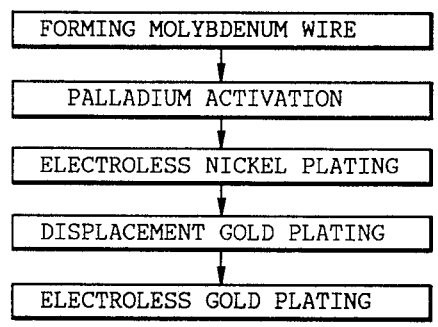
FIG. 7 is a flow chart of an example of a process of applying electroless gold plating onto molybdenum wires, showing a plating method of successively laminating a nickel film by electroless plating, a gold film by displacement plating, and a gold film by electroless plating on the surface of the molybdenum wires after the surface of the molybdenum wires has been activated by a palladium activating solution.

The present electroless gold plating solution was applied to each alumina ceramic board 6 that was the same as shown in Example 6 except that the die-bonding pad 7 and the wire bonding pads 8 were made of molybdenum, and the plating process shown in FIG. 7 was applied. The board was subjected to activation, nickel plating, and replacement gold plating in the same way as in Example 6, and then was immersed for 3 hours in the electroless gold plating solution having the composition shown in (a) in Example 1 under the plating conditions shown therein, and the plating solution was stirred forcibly. The thickness of the deposited gold film was 1.7 μm. The thus-formed 20 ceramic boards were used as samples, and the joining properties of the gold plated parts thereof were assessed in the same way as in Example 6. All of the 20 samples were assessed as good ones. Therefore, when electroless gold plating solutions according to the present invention are used, a ceramic circuit board having conducting paths of molybdenum and excellent in joining properties can be obtained safe working environment.

EXAMPLE 8

Figure 12A:
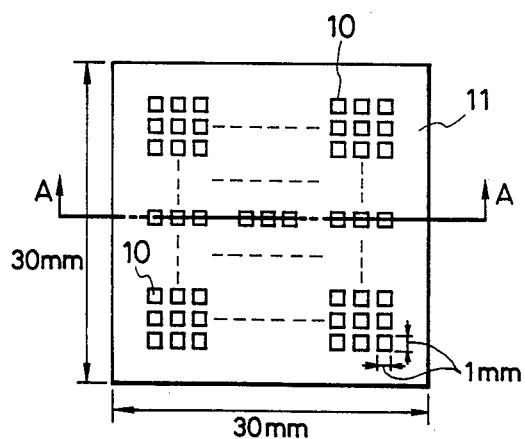
FIG. 12 (a) is a plan view of a ceramic circuit board and a printed circuit board plated with gold by using an electroless plating solution according to the present invention, and FIG. 12 (b) is a sectional view taken along line A—A of FIG. 12 (a).
Figure 12B:
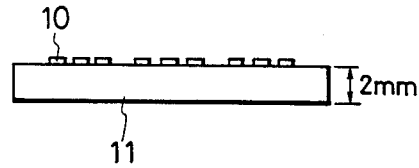

20 ceramic circuit boards each having on an alumina ceramic 11 a wiring pattern 10 that is shown in FIG. 12 and was made of tungsten conductor, with the interval between the conducting paths being varied for each group of 20, were prepared. Specifically, 20 ceramic circuit boards with the interval between the conducting paths being 300 μm, 20 similar ceramic circuit boards with the interval between the conducting paths being 200 μm, 20 similar ceramic circuit boards with the interval between the conducting paths being 100 μm, and 20 similar ceramic boards with the interval between the conducting paths being 30 μm, were prepared. The boards were plated by using the plating process shown in FIG. 6. After the tungsten surface constituting the wiring pattern 10 was activated by a usual palladium activator, a nickel film having a thickness of 5 μm was formed by using a usual electroless nickel plating solution, and thereon displacement plating was carried out by using a usual displacement gold plating solution. The thicknesses of the gold films on all the boards were measured by an X-ray fluorescence coating thickness gauge and were found to be 0.2 to 0.4 μm. 10 samples of each of the four types different in the interval between the conducting paths were plated by using an electroless gold plating solution having the following composition under the following conditions.

| Composition of the plating solution and plating conditions | |
|---|---|
| Sodium tetrachloroaurate (III) | 0.01 mol/l |
| Sodium thiosulfate | 0.08 mol/l |
| Thiourea | 0.05 mol/l |
| Sodium sulfite | 0.4 mol/l |
| Sodium tetraborate | 0.1 mol/l |
| Water | 1 l |
| Solution temperature | 80° C. |
| pH | 9.0 |

The remaining boards were plated with gold by using a usual electroless gold plating solution containing cyanide ions for comparison. For both plating solutions, the gold plating time was 2 hours. After the plating, the thicknesses of the gold films were measured, and in the case using the electroless gold plating solution having the above composition, the thicknesses were 1.9 to 2.3 μm, and in the case using the usual electroless gold plating solution, the thicknesses were 1.8 to 2.1 μm. The surfaces of the thus prepared ceramic circuit boards were observed by an optical microscope, and assessment was made such that if of 10 circuit boards there were 2 or more circuit boards wherein gold deposited between the conducting paths of the wiring pattern 10 to form a short circuit, they were judged to be defective, and if of 10 circuit boards there was 0 or 1 circuit board wherein gold deposited between the conducting paths of the wiring pattern 10 to form a short circuit, the circuit board was judged to be good. The results are shown in Table 2.

TABLE 2

| Interval between conducting paths (μm) | Plating solution according to the invention | Usual plating solution |
|---|---|---|
| 300 | good | good |
| 200 | good | defective |
| 100 | good | defective |
| 30 | good | defective |

Thus, when an electroless gold plating solution according to the invention is used, a gold film having a thickness of 0.5 μm or over can be formed by plating on the surface of conducting paths with the interval between them being 200 μm or below on a ceramic circuit board, and a short circuit by deposition of gold on the insulator surface of the board would not occur at all.

EXAMPLE 9

Figure 9:
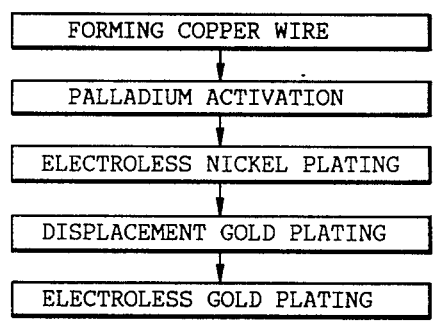
FIG. 9 is a flow chart of an example of a process of applying electroless gold plating onto copper wires, showing a plating method of successively laminating a nickel film by electroless plating, a gold film by displacement plating, and a gold film by electroless plating on the surface of the copper wires after the surface of the copper wires has been activated by a palladium activating solution.

20 printed circuit boards each having on a copper-lined laminate (an epoxy resin laminate having a copper film with a thickness of 35 μm) 11 a wiring pattern 10 that is shown in FIG. 12, with the interval between the conducting paths being varied for each group of 20, were prepared. Specifically, 20 ceramic circuit boards with the interval between the conducting paths being 300 μm, 20 similar printed circuit boards with the interval between the conducting paths being 200 μm, 20 similar printed circuit boards with the interval between the conducting paths being 100 μm, and 20 similar printed circuit boards with the interval between the conducting paths being 30 μm were prepared. Those boards were plated by the plating process shown in FIG. 9. The copper surface having the wiring pattern 10 was activated by immersing the board at room temperature for 2 min in a palladium activator having the composition shown below.

| Composition of the palladium activator | |
|---|---|
| Water | 1 l |
| Palladium chloride | 0.2 g/l |
| Hydrochloric acid | 50 ml/l |

Thereafter, a nickel film having a thickness of 5 μm was formed by using a usual electroless nickel plating solution, and thereon replacement gold plating was carried out by using a usual replacement gold plating solution. The thicknesses of the gold films on all the boards were measured by an X-ray fluorescence coating thickness gauge and were found to be 0.2 to 0.3 μm. 10 samples of each of the four types of the boards different in the interval between the conducting paths were plated with gold by using an electroless gold plating solution having the following composition.

| Composition of the plating solution and plating conditions | |
|---|---|
| Sodium dithiosulfatoaurate (I) | 0.02 mol/l |
| Sodium thiosulfate | 0.20 mol/l |
| Thiourea | 0.15 mol/l |
| Sodium sulfite | 0.2 mol/l |
| Ammonium chloride | 0.1 mol/l |
| Water | 1 l |
| Solution temperature | 80° C. |
| pH | 8.0 |

For comparison the remaining boards were plated with gold by using a usual electroless gold plating solution containing no cyanide ions similarly to Example 8. After the plating, the thicknesses of the gold films were measured, and in the case using the plating solution having the above composition, the thicknesses were 1.7 to 2.0 μm, whereas in the case using the above commercially available plating solution, the thicknesses were 1.6 to 1.8 μm. The surfaces of the thus prepared printed circuit boards were observed by an optical microscope, and assessment was made such that if of 10 circuit boards there were 2 or more circuit boards wherein gold deposited between the conducting paths of the wiring pattern 10 to form a short circuit, they were judged to be defective, and if of 10 circuit boards there was 0 or 1 circuit board wherein gold deposited between the conducting paths of the wiring pattern 10 to form a short circuit, the circuit board was judged to be good. The results are shown in Table 3.

TABLE 3

| Interval between conducting paths (μm) | Plating solution according to the invention | Usual plating solution |
|---|---|---|
| 300 | good | good |
| 200 | good | defective |
| 100 | good | defective |
| 30 | good | defective |

Thus when an electroless gold plating solution according to the invention is used, a gold film having a thickness of 0.5 μm or over can be formed on a surface wiring system on a printed circuit board with the interval between the conducting paths being 200 μm or below by plating, and therefore a printed circuit board on which parts can be mounted highly densely can be produced. Moreover, a short circuit due to deposition of gold on the insulator surface of the board would not occur.

EXAMPLE 10

Figure 13:
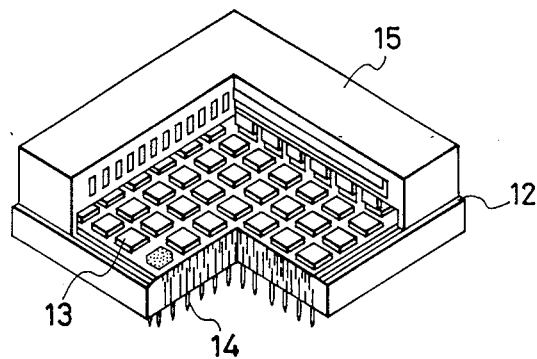
FIG. 13 is a sectional perspective view of a module having a circuit board plated with gold by using an electroless gold plating solution according to the present invention.
Figure 14:
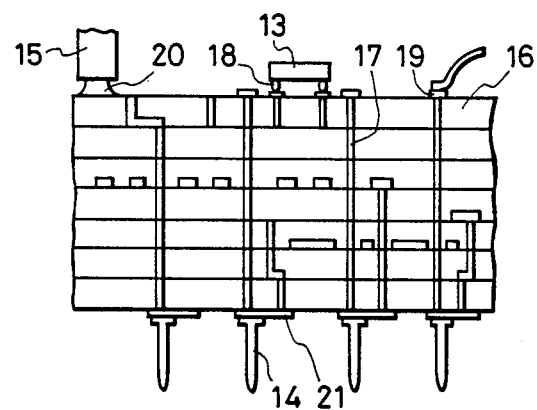
FIG. 14 is a sectional view of the module of FIG. 13, showing mainly the multi-layer ceramic circuit board.
Figure 15:
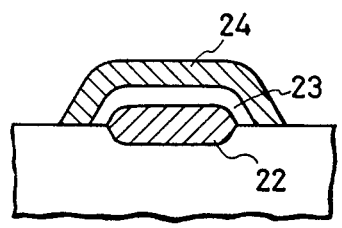
FIG. 15 is a sectional view, on an enlarged scale, of part of the surface conducting paths of the multi-layer ceramic circuit board of the module of FIG. 13.

This is an example wherein gold plating by using an electroless gold plating solution according to the invention was applied to a multi-layer ceramic circuit board 12 of a module shown in FIG. 13. The multi-layer ceramic circuit board 12 had a structure shown in FIG. 14, and consisted of a ceramic insulator 16 and tungsten conducting paths 12. On the first principal plane of the board, there are chip joining pads 18 to which semiconductor chips 13 will be joined by soldering, engineering change pads 19 where wire bonding for wiring alteration will be made, and sealing pads 20 where caps 15 for seal into which a refrigerant will be passed will be soldered, and on the second principal plane, there are brazing pads 21 for pins where I/O pins 14 will be brazed. Connections by soldering, wire bonding, or brazing will be made to these tungsten surface conducting paths, so that the tungsten 22 is covered with a nickel film 23, and then a gold film 24 as shown in FIG. 15.

Figure 16:
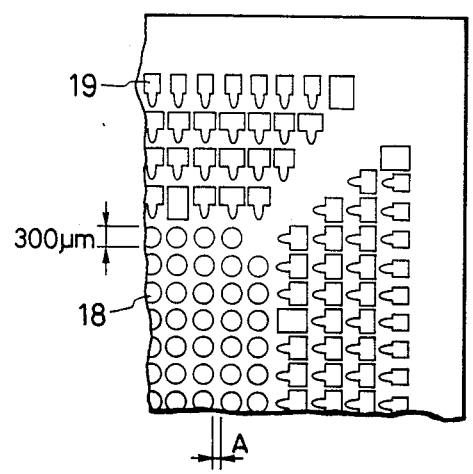
FIG. 16 is a plan view of part of the first principal plane of the above multi-layer ceramic circuit board.

Five types of multi-layer ceramic circuit boards were prepared, that is, ones wherein the interval A between chip joining pads 18 (shown in FIG. 16) was 10 μm, ones wherein the interval A between chip joining pads 18 (shown in FIG. 16) was 50 μm, ones wherein the interval A between chip joining pads 18 (shown in FIG. 16) was 100 μm, ones wherein the interval A between chip joining pads 18 (shown in FIG. 16) was 200 μm, and ones wherein the interval A between chip joining pads 18 (shown in FIG. 16) was 400 μm, were prepared. For each type of the above five types where the intervals between the conducting paths were different, 10 multi-layer ceramic boards whose major component was alumina, and 10 multi-layer mullite ceramic boards whose major component was mullite, were prepared. After tungsten constituting the surface wiring system of each board was activated by a usual palladium activator, a nickel film having a thickness of 5 μm was formed thereon by using a usual electroless nickel plating solution, and then gold plating was made thereon by using a usual displacement gold plating solution. The thicknesses of the gold films on circuit boards whose major component was alumina and circuit boards whose major component was mullite were measured by an X-ray fluorescence coating thickness gauge, and were found to be 0.1 to 0.3 μm. These boards were plated with gold by using an electroless gold plating solution according to the invention having the following composition under the following plating conditions.

| Composition of the plating solution and plating conditions | |
|---|---|
| Sodium tetrachloroaurate (III) | 0.015 mol/l |
| Sodium thiosulfate | 0.1 mol/l |
| Thiourea | 0.04 mol/l |
| Sodium sulfite | 0.3 mol/l |
| Sodium tetraborate | 0.1 mol/l |
| Water | 1 l |
| Solution temperature | 80° C. |
| pH | 9.0 |

The above plating solution was stirred forcibly, and after plating for 2 hours, the thicknesses of the deposited gold films were measured, and in either case wherein the major component of the circuit boards was alumina and case wherein the major component of the circuit boards was mullite, the thicknesses of the gold films were 2.0 to 2.3 μm. For comparison, multi-layer ceramic circuit boards were plated for 2 hours in the same way as above, except that, as the electroless gold plating solution, a usual electroless gold plating solution containing cyanide ions was used. The thicknesses of the deposited gold films were measured, and in either case wherein the major component of the circuit board was alumina and case wherein the major component of the circuit board was mullite, the thicknesses were 1.8 to 2.0 μm. The surfaces of the thus prepared multi-layer ceramic circuit boards were observed by an optical microscope to examine whether there was a short circuit due to the deposition of gold on the insulator surface. With respect to 10 multi-layer ceramic circuit boards of each of five types whose major component was alumina and that had a certain interval between the conducting paths, and 10 multi-layer ceramic boards of each of five types whose major component was mullite and that had a certain interval between the conducting paths, the numbers of boards wherein a short circuit was observed are shown in Table 4. In all of the circuit boards plated with gold by using the present electroless gold plating solution, any short circuit was not found at all.

TABLE 4

| Interval between conducting paths (μm) | Multi-layer ceramic circuit board whose major component was alumina | | Multi-layer ceramic circuit board whose major component was mullite | |
|---|---|---|---|---|
| | Plating solution according to the invention | Usual plating solution | Plating solution according to the invention | Usual plating solution |
| 400 | 0 | 0 | 0 | 0 |
| 200 | 0 | 4 | 0 | 5 |
| 100 | 0 | 10 | 0 | 10 |
| 50 | 0 | 10 | 0 | 10 |
| 10 | 0 | 10 | 0 | 10 |

Then, using circuit boards wherein any short circuit was not observed, modules were assembled as shown in FIG. 13. Semiconductor chips 13 were soldered, wire bonding or brazing of I/O pins was made to engineering change pads 19, and caps 15 for seal were soldered. I/O pins 14 were joined by using gold-germanium brazing filler metal.

The joined sections of the assembled modules were checked as follows. With respect to the soldering of the semiconductor chips, the wire bonding, and the brazing of I/O pins, electrical check was carried out by passing an electric signal to all the joined sections. With respect to the soldering of the sealed sections, after the inside of each of the modules was filled with helium gas, and then was made gas-tight, the module was placed in a container that has been evacuated thereby examining whether there was a leak of the helium gas. Thus, with respect to all the assembled modules, it has been confirmed that there were no defective joining of the semiconductor chips, and no defective wire bonding, and there was no leak of the helium gas at the sealed sections, which showed no defective joining of the sealed sections.

With respect to each of the assembled modules, the delay property of an electric signal due to the board was measured. Thus it was found that the signal delay due to the circuit boards having an interval of 50 μm between the conducting paths obtained by using the present electroless gold plating solution was about ¼ of that of the circuit boards having an interval of 200 μm between the conducting paths that was minimum when the usual electroless gold plating solution was used.

Thus, by plating a board of a module with gold by using an electroless gold plating solution according to the invention, a board on which parts can be mounted highly densely, and wherein the joint reliability is high can be produced in a high yield. Consequently, a module wherein the electric signal delay due to the board is small can be produced. In particular, when the present electroless gold plating solution is applied to gold plating of a board of a module for electronic computers, parts can be mounted more densely than in the case wherein a usual electroless gold plating solution is applied, and a module wherein the electric signal delay due to the board is less can be produced in a high yield, so that the present invention is effective for the mass production of high-speed electronic computers.

EXAMPLE 11

Figure 17:
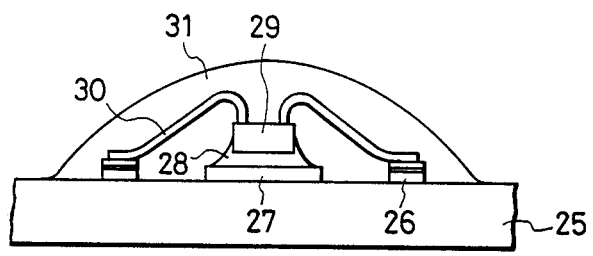
FIG. 17 is a partially sectional view of an electronic device having electronic elements mounted directly on a printed circuit board, with electroless gold plating according to the invention having been applied to the electronic device.
Figure 18:
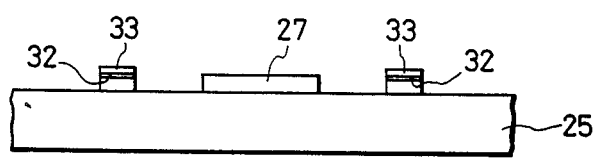
FIG. 18 is a sectional view of the surface conducting paths of the printed circuit board of FIG. 17.

A copper-clad laminate 25 (the substrate being glass-/epoxy resin) was used to form a printed circuit board for a chip-on-board (COB) wherein semiconductor chips will be directly mounted without using a package onto the printed circuit board as shown in FIG. 17, and a conductor circuit was formed by a usual circuit forming method (subtract method). Then after other part than the wire bonding pad 26a in FIG. 17 was selectively masked by a dry film resist, the board was immersed in a palladium activating solution ($PdCl_2$: 0.2 g/l; HCl: 50 ml/l) to activate the conductor surface. Then, by using an electroless nickel plating solution, a displacement gold plating solution, and an electroless gold plating solution having the composition and plating conditions shown below, a nickel coating having a thickness of 1 μm (32), and a gold coating having a thickness of 3 μm (33) were formed on the bonding pad 26 (on copper). (The resist was removed after the plating) to form a printed circuit board having a bonding pad consisting of a metallized constitution as shown in FIG. 18.

| Composition of the electroless gold plating solution | |
|---|---|
| Sodium chloroaurate | 0.01 mol/l |
| Sodium thiosulfate | 0.1 mol/l |
| Sodium sulfite | 0.4 mol/l |
| Sodium tetraborate | 0.1 mol/l |
| Thiourea | 0.05 mol/l |
| Plating conditions | |
| pH: 9.0 | |
| Temperature: 80° C. | |

A semiconductor element (chip) 29 was joined onto the die-bonding pad 27 on the board by using a conductive epoxy adhesive (containing Ag). Then by using a thermonic bonder (bonding pressure: 100 g), gold wires having a diameter of 30 μm were joined to the bonding pad of the semiconductor element 29 and the bonding pad 26 on the board. The joined states were assessed by tension test of the gold wires, and were found to be the tearing mode of the gold wires, and good bonding ability was confirmed.

EXAMPLE 12

Figure 6:
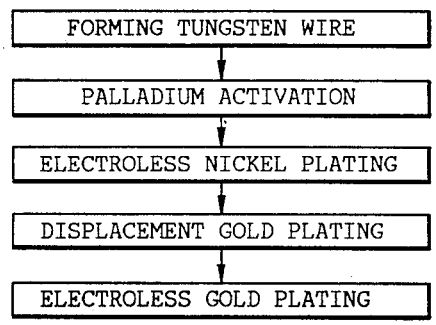
FIG. 6 is a flow chart of an example of a process of applying electroless gold plating onto the surface of tungsten wires, showing a plating method of successively laminating a nickel film by electroless plating, a gold film by displacement plating, and a gold film by electroless plating on the surface of the tungsten wires after the surface of the tungsten wires has been activated by a palladium activating solution.

As shown in FIGS. 19 and 20, each leadless chip carrier formed with tungsten wires (die-bonding pads 35, wire bonding pads 36, soldering pads 38, and through-holes 37) that were formed on an alumina ceramic board 34 by a usual method was plated according to the plating process shown in FIG. 6. First, the tungsten was activated by using a usual palladium activating solution, a nickel coating having a thickness of 4 μm was formed by using a usual electroless nickel plating solution, and then a gold coating having a thickness of 0.1 μm was formed by using a usual displacement gold plating solution. 20 leadless chip carriers thus formed were immersed in the present electroless gold plating solution having the composition and plating conditions mentioned in Example 10 to form a gold coating having a thickness of 2 μm.

Figure 21:
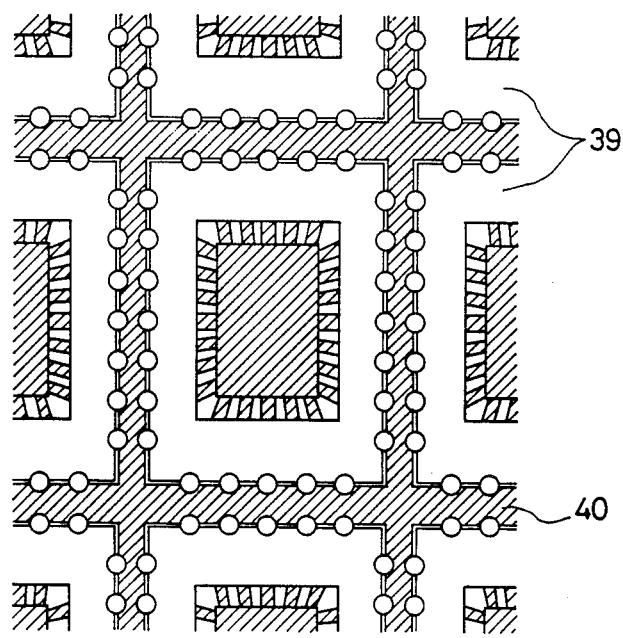
FIG. 21 is a plan view of a ceramic circuit board wherein a plurality of leadless chip carriers and conducting paths for their electroplating are formed together.

Since the prior plating was carried out by using an electroplating solution, electroplating was also carried out for comparison. In this case, as shown in FIG. 21, conducting paths of leadless chip carriers 39 and conducting paths 40 for continuity between the conducting paths of leadless chip carriers were formed on the same alumina ceramic boards followed by electroplating. Thereafter the conducting paths for continuity were broken and removed to form a single leadless chip carriers. The electroplating was carried out as follows. A nickel coating having a thickness of 4 μm was formed on the tungsten wires by using a usual nickel electroplating solution, and then a gold coating having a thickness of 2 μm was formed thereon by using a usual gold electroplating solution. After the completion of the plating, the board was broken, and the single leadless chip carriers were taken out.

The thus-formed leadless chip carriers that had been subjected to the electroless plating and the thus-formed leadless chip carriers that had been subjected to the electroplating were assessed by steam aging described below That is, about 1 l of pure water was boiled in a 2-l beaker, and each leadless chip carrier was placed about 3.8 mm over the water surface, and was allowed to stand for 1 hour with ⅛ of the opening of the beaker covered. One wherein the soldering pads 38 were not discolored, and when solder dipping was done to the soldering pads 95% or over of the area of the soldering pads were wetted, was judged to be good. Thus, all 20 leadless chip carriers prepared by using the present electroless gold plating solution were judged to be good, whereas of 20 leadless chip carriers prepared by using the conventional electroplating process, only 3 leadless chip carriers were judged to be good.

Figure 22:
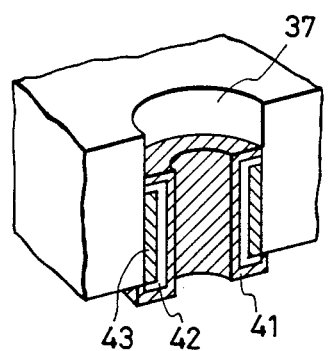
FIG. 22 is an enlarged view of a through-hole section of the above leadless chip carrier.

This result will be attributed to the following reason. When an electroless gold plating according to the invention is applied, all the surface of conducting paths is covered with a gold coating free from any pinholes On the other hand, if the conventional electroplating is carried out, a fracture of the through-hole 37 as shown in FIG. 22 will be formed by breaking and removing the conducting paths for continuity, resulting in the exposure of the nickel 42 and the tungsten 43 under the gold coating 41. These metals will be turned to oxides by the steam aging, and the oxides will spread to the soldering pad 38, causing defective wetting. Further, when the conventional electroless gold plating solution is used, the above problem will not occur, but gold is likely to deposit on the ceramic of the board of the leadless chip carrier, and the yield will become poor. Therefore, when the electroless gold plating solution of the present invention is applied to gold plating of a leadless chip carrier, a leadless chip carrier high in joint reliability can be produced in a high yield.

EXAMPLE 13

Figure 8:
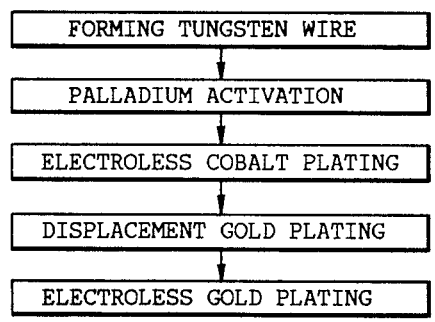
FIG. 8 is a flow chart of an example of a process of applying electroless gold plating onto tungsten wires, showing a plating method of successively laminating a cobalt film by electroless plating, a gold film by replacement plating, and a gold film by electroless plating on the surface of the tungsten wires after the surface of the tungsten wires has been activated by a palladium activating solution.

After tungsten wires were formed on each alumina ceramic board 34 in a usual manner, each leadless chip carrier shown in FIGS. 19 and 20 was plated according to the plating process shown in FIG. 8. First, the tungsten was activated by using a usual palladium activating solution, a cobalt coating having a thickness of 4 μm was formed by using a usual electroless cobalt plating solution, and then a gold coating having a thickness of 0.1 μm was formed by using a usual displacement gold plating solution. 20 leadless chip carriers thus prepared were immersed in an electroless gold plating solution having the composition and plating conditions shown in Example 10 according to the invention to form a gold coating having a thickness of 2 μm. In the same manner as in Example 12, electroplating was also carried out for comparison. The boards used were suitable for electroplating, and the same as used in Example 12 as shown in FIG. 21, and a cobalt coating having a thickness of 4 μm, and a gold coating having a thickness of 2 μm, were formed by using a usual cobalt electroplating solution, and a usual gold electroplating solution, respectively. The boards were broken to prepare 20 leadless carriers.

After these electroless plated leadless chip carriers, and electroplated leadless chip carriers, were subjected to steam aging in the same way as Example 12, the wettability of the soldering pads 38 was assessed All of 20 leadless chip carriers prepared by using the present electroless gold plating solution were judged to be nondefective, whereas of 20 leadless chip carriers prepared by using the electroplating, only 4 leadless chip carriers were judged to be good. The cause was the same as that in Example 12. In the case where the conventional electroless gold plating solution was used, gold was liable to deposit on the ceramic, and the yield was poor. Therefore, by the plating process using the present electroless gold plating solution, a leadless chip carrier high in joint reliability can be produced in a high yield.

EXAMPLE 14

Figure 23:
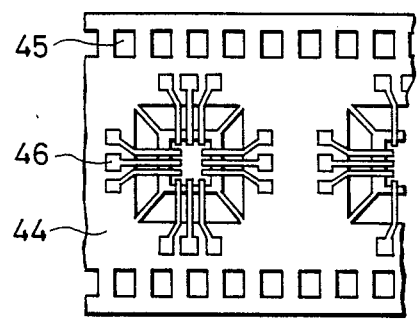
FIG. 23 is a plan view of a tape carrier plated with gold by using an electroless gold plating solution according to the invention.
Figure 24:
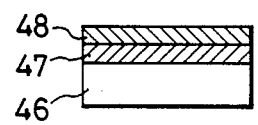
FIG. 24 is a cross-sectional view of the tape carrier of FIG. 23.
Figure 25:
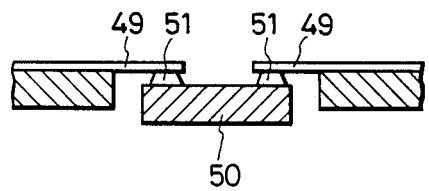
FIG. 25 is a view showing the layer structure of the film on the copper wires of the above tape carrier.

A tape carrier as shown in FIG. 23 was formed in the following steps. An insulating film 44 of polyimide or the like to which a copper foil having a thickness of 35 μm was formed with sprocket holes 45 for feeding the tape. Then after a prescribed resist pattern was formed by a usual photo-process, the copper foil was etched with an etching solution containing ammonium persulfate or the like to form prescribed copper wires 46. Thereafter, the surface of the copper wires was activated by an activating solution containing palladium chloride and hydrochloric acid, and then a nickel coating 47 having a thickness of about 3 μm was formed by using an electroless nickel plating solution containing nickel sulfate as a major component and sodium hypophosphite as a reducing agent. Then, a gold coating having a thickness of about 0.1 μm was formed on the nickel coating by using a displacement gold plating solution containing potassium dicyanoaurate (I) as a major component. This gold coating was used as a catalyst to form a gold coating 48 having a thickness of about 1 μm by using the above present electroless gold plating solution. The layer structure of the plated coatings formed on the above copper wires is shown in FIG. 24. As shown in FIG. 25, tips 49 of the copper wires of the tape carrier thus formed and bumps of gold formed on a semiconductor 50 were bonded by thermocompression. The bond strength was measured, and a tensile strength of 50 g or over per bump was obtained This strength is twice or more as high as a tensile strength of about 20 g of the case wherein only replacement gold plating is carried out, that is, the thickness of gold is about 0.1 μm.

To form a gold coating having a thickness of about 1 μm, both a cyanide type electroless gold plating solution, and electroplating can be used. However, in the case of a cyanide type electroless gold plating, since the solution temperature is 90° C., and the pH is 13, a base film of polyimide or the like, and an adhesive bonding copper wires and the base film will be melted, so that the cyanide type electroless gold plating solution cannot be used. In the case of electroplating, since a pattern for electricity supply has to be formed, the efficiency of the utilization of the base film is decreased, and the cost becomes high.

EXAMPLE 15

An x-ray lithography mask according to the present invention and its manufacture will now be described.

Figure 26:
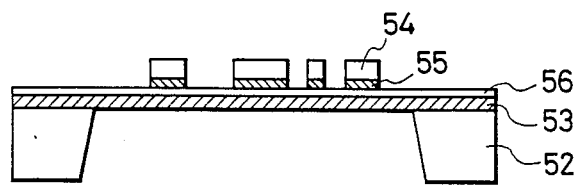
FIG. 26 is a cross-sectional view of an X-ray lithography mask plated with gold by using an electroless gold plating solution according to the invention.
Figure 27A:
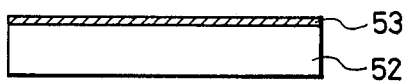
FIG. 27 is a chart showing the manufacturing process of the above X-ray lithography mask.
Figure 27B:
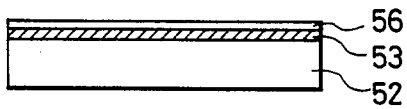
Figure 27C:
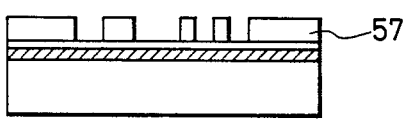
Figure 27D:
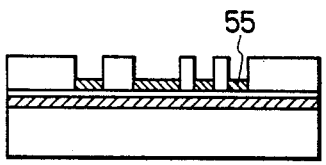
Figure 27E:
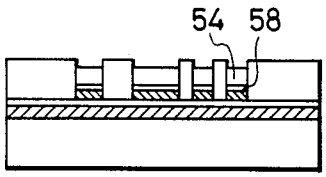
Figure 27F:
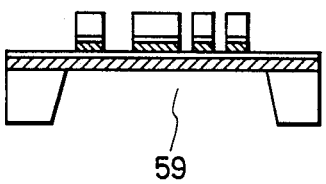

FIG. 26 is a cross-sectional view of the constitution of an X-ray lithography mask according to the present invention. An X-ray transparent substrate 53 is formed on a mask board 52, for example, a silicon single crystal board. The X-ray transparent substrate 53 has a thickness of 0.5 to 5 μm, and comprises a film of a high-temperature resin, such as polyimide, and polyimidoamide, and an inorganic compound and a metal having a higher X-ray transmission such as silicon oxide, silicon nitride, boron, and titanium. On the X-ray transparent substrate the X-ray absorption pattern 54 having a prescribed shape was formed by using the above present electroless gold plating solution. For the purpose of improving the adhesion between the X-ray absorption pattern and the X-ray transparent substrate, an underlay film 55 of nickel, copper or the like, and an adhesive layer 56 may be formed additionally.

Referring to FIG. 27, the process of production of the present X-ray lithography mask will now be described. (a) A mask board 52 such as a silicon wafer is coated with polyimide varnish followed by baking to form a polyimide support substrate 53 having a thickness of 2 μm. (b) Then, a synthetic rubber type adhesive is applied onto the polyimide substrate, and is dried, and the polyimide substrate is immersed in an etching solution whose major components are chromic acid and sulfuric acid thereby roughening the surface of the adhesive layer 56 to improve the adhesion. (c) The surface of the adhesive layer 56 is activated by an acidic activating solution whose major components are palladium chloride and tin (II) chloride. Thereafter, a photoresist 57 is applied by the usual photo-process followed by baking to form a prescribed pattern, and development is effected to form a prescribed X-ray absorption pattern. (d) Then, a nickel underlay film 55 is deposited on the X-ray absorption pattern section where the activated adhesive layer surface is exposed by using an electroless nickel plating solution containing, as a major component, nickel sulfate, and as a reducing agent, sodium hypophosphite so that the nickel underlay film 55 may have a thickness of about 0.5 μm. (e) By using a displacement gold plating solution whose major component is sodium dicyanoaurate (I), a displacement reaction between nickel and gold is allowed to take place so that a gold film 56 having a thickness of about 0.1 μm may be deposited on the nickel underlay film. Thereafter, by using the above present electroless gold plating solution, gold 54 is deposited by reduction with the gold 58 serving as a catalyst so that the gold 54 may have a thickness of about 0.6 μm. (f) The silicon board 52 is formed with a hole 59 by using an etching solution whose major component is sodium hydroxide with the undersurface of the silicon board formed with an etching mask. Finally, the photoresist, and the etching mask are removed.

As described above, according to the invention, the circumference effect (the phenomenon that an electric current is more concentrated to the circumferential section of an object to be plated than to the central part of the object and the thickness of plating at the circumferential section becomes greater than the central section) of the thickness of plating due to the electrical potential distribution which is a fundamental theme in electroplating did not occur, and therefore, an X-ray absorption pattern wherein the thickness of the coating is 0.6±0.05 μm that is quite uniform could be formed. Thus, blur of the pattern at the circumferential section of the mask by the slant incident light of an X-ray could be reduced substantially.

Further, since in the present invention an underlay film for electricity supply that is essential in electroplating is not required, a step of etching an underlay film for masking the X-ray absorption pattern is not required, so that there were no possibilities that the lowering of the adhesion of the X-ray absorption pattern due to side etching would occur, and an X-ray absorption pattern having a size of 1 μm or less and high in adhesion could be produced in a high yield.

Since in the present electroless gold plating solution, the solution temperature is 80° C., and the pH is 9, which are quite milder in comparison with those of the known cyanide type electroless gold plating solution that has a solution temperature of 90° C., and a pH of 13, a photoresist pattern need not be deformed. Further, since hydrogen gas is not released along with the deposition reaction of gold as in the case of a cyanide type electroless gold plating, release of a photoresist due to the release of hydrogen gas would not occur. Therefore, the formation of an X-ray pattern quite good in dimensional accuracy has become possible.

What is claimed is:

1. An electronic device comprising a ceramic substrate having conducting paths thereon, the conducting paths being directly in contact with the ceramic substrate, the conducting paths including a plurality of conducting paths that are each spaced less than 200 μm from the closest adjacent conducting path, the conducting paths including a first conductor layer on and in direct contact with the ceramic substrate and a second conductor layer on the first conductor layer, and a gold layer on the second conductor layer, the gold layer being at least 0.5 μm thick and not being deposited between the conducting paths, whereby electrical shorting between the conducting paths due to gold deposited therebetween is avoided.

2. An electronic device according to claim 1, wherein said first conductor layer is a tungsten or molybdenum layer.

3. An electronic device according to claim 1, wherein the conducting paths further include a gold thin film on said second conductor layer, and said gold layer on said gold thin film.

4. An electronic device according to claim 3, wherein said first conductor layer is a tungsten or molybdenum layer.

5. An electronic device according to claim 4, wherein said second conductor layer is a nickel or cobalt layer.

6. An electronic device according to claim 1, wherein the second conductor layer is a nickel or cobalt layer.

7. An electronic device according to claim 6, wherein the first conductor layer is a tungsten or molybdenum layer.

8. An electronic device according to claim 6, wherein the first conductor layer is a copper layer.

9. An electronic device according to claim 1, wherein the first conductor layer is a copper layer.

10. An electronic device according to claim 1, wherein the electronic device is a module.

11. An electronic device according to claim 1, wherein the electronic device is a circuit board.

12. An electronic device according to claim 11, wherein the electronic device is a multi-layer circuit board.

13. An electronic device according to claim 12, wherein said substrate is an uppermost insulating layer of the multi-layer circuit board.

14. An electronic device according to claim 11, wherein the conducting paths include a first conductor layer of copper.

15. An electronic device according to claim 1, wherein the ceramic substrate is formed of alumina or mullite.

16. An electronic device according to claim 15, wherein the second conductor layer is a nickel or cobalt layer.

17. An electronic device according to claim 16, wherein the first conductor layer is a tungsten or molybdenum layer.

18. An electronic device according to claim 16, wherein the first conductor layer is a copper layer.

19. An electronic device according to claim 15, wherein the conducting paths further include a gold thin film on said second conductor layer, and said gold layer on said gold thin film.

20. An electronic device according to claim 1, wherein said conducting paths include bonding pads spaced from the closest adjacent bonding pad by less than 200 $\mu$m, and the electronic device further comprises at least one semiconductor chip, the at least one semiconductor chip being connected to the bonding pads by wires, the bonding pads including the gold layer.

21. An electronic device according to claim 20, wherein the bonding pads further include a solder layer on the gold layer, the wires connecting the semiconductor chip to the bonding pads being attached to the bonding pads via the solder layer and the gold layer.

22. An electronic device according to claim 21, wherein said first conductor layer is a tungsten or molybdenum layer.

23. An electronic device according to claim 21, wherein the second conductor layer is a nickel or cobalt layer.

24. An electronic device according to claim 23, wherein the first conductor layer is a tungsten or molybdenum layer.

25. An electronic device according to claim 21, wherein the conducting paths further include a gold thin film on said second conductor layer, said gold layer being on said gold thin film.

26. An electronic device according to claim 1, wherein the first and second conductor layers are made of different electrically conducting materials.

27. An electronic device for mounting and interconnecting a plurality of integrated circuit semiconductor devices, comprising:
a ceramic substrate provided with a plurality of pads on a top surface, said pads being spaced from each other by a distance less than 200 $\mu$m, said pads being in direct contact with the ceramic substrate and including a first conductor layer on and in direct contact with the ceramic substrate and a second conductor layer on the first conductor layer,
a gold layer deposited electrolessly on said second conductor layer, electrical insulation between said pads being maintained by means of avoiding deposition of said fold layer on the substrate in the space between pads, said plurality of integrated circuit semiconductor devices being mounted on said ceramic substrate, said integrated circuit semiconductor devices being connected electrically to said pads through said gold layer and a layer of solder on the gold layer, and
a sealing means for said integrated circuit semiconductor devices.

28. An electronic device according to claim 27, wherein the ceramic substrate is a circuit board.

29. An electronic device according to claim 27, wherein the ceramic substrate is a part of a module.

30. An electronic device according to claim 27, wherein the gold layer has a thickness of at least 0.5 $\mu$m.

31. An electronic device for mounting and interconnecting a plurality of integrated circuit semiconductor devices, comprising:
a ceramic substrate provided with a plurality of pads on a top surface, said pads being spaced from each other by a distance less than 200 $\mu$m, said pads being in direct contact with the ceramic substrate and including a first conductor layer on and in direct contact with the ceramic substrate and a second conductor layer on the first conductor layer,
a gold layer deposited electrolessly on said second conductor layer, electrical insulation between said pads being maintained by means of avoiding deposition of said gold layer on the substrate in the space between pads, said plurality of integrated circuit semiconductor devices being mounted on said ceramic substrate, said integrated circuit semiconductor devices being connected electrically to said pads through said gold layer and a layer of solder on the gold layer, and
a sealing means for said integrated circuit semiconductor devices.

32. An electronic device according to claim 31, wherein the gold layer has a thickness of at least 0.5 $\mu$m.

33. An electronic device for mounting and interconnecting a plurality of integrated circuit semiconductor devices, comprising:
a ceramic substrate having top and bottom surfaces, provided with a plurality of pads for connecting to said integrated circuit semiconductor devices, and with engineering change pads, on the top surface, and provided with input/output pis on the bottom surface, said pads being in direct contact with the ceramic substrate and spaced from each other by a distance less than 200 $\mu$m, the pads comprising a first conductor layer on and in direct contact with said ceramic substrate, and coated with a second conductor layer,
a gold layer deposited electrolessly on said second conductor layer from a plating solution that does not contain a cyanide compound, electrical insulation between said pads being maintained by means of avoiding deposition of said gold layer on the substrate in the space between pads, said plurality of integrated circuit semiconductor devices being mounted on said ceramic substrate, said integrated circuit semiconductor devices being connected electrically to said pads through said gold layer and a layer of solder on the gold layer, and
a sealing means for said integrated circuit semiconductor devices.

34. An electronic device according to claim 33, wherein the gold layer has a thickness of at least 0.5 $\mu$m.

35. An electronic device comprising a ceramic substrate having conducting paths thereon, the conducting paths being directly in contact with the ceramic substrate, the conducting paths including a plurality of conducting paths that are each spaced less than 200 μm from the closest adjacent conducting path, the conducting paths including a first conductor layer on and in direct contact with the ceramic substrate and a second conductor layer on the first conductor layer, and a gold layer on the second conductor layer, the gold layer being a layer formed by electroless deposition, the gold layer being at least 0.5 μm thick and not being deposited between the conducting paths, whereby electrical shorting between the conducting paths due to gold deposited therebetween is avoided.

36. An electronic device according to claim 35, wherein the electrolessly deposited gold layer is a layer deposited from an electroless gold plating solution comprising an aqueous solution that contains monovalent gold ions, a reducing agent, and a complexing agent which has a greater bond energy to a monovalent gold ion than a hydroxide ion has.

* * * * *